(12) United States Patent
Yoneda

(10) Patent No.: US 6,429,100 B2
(45) Date of Patent: *Aug. 6, 2002

(54) METHOD OF MANUFACTURING A SEMICONDUCTOR DEVICE

(75) Inventor: Kiyoshi Yoneda, Gifu (JP)

(73) Assignee: Sanyo Electric Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/865,476

(22) Filed: May 29, 1997

(30) Foreign Application Priority Data

May 31, 1996 (JP) .............................. 8-139206

(51) Int. Cl.$^7$ .................. C30B 21/36; H01L 21/20
(52) U.S. Cl. .................. 438/487; 438/166; 438/308; 117/904
(58) Field of Search ................ 438/166, 308, 438/487, 795; 117/904; 148/DIG. 91, DIG. 90, DIG. 92

(56) References Cited

U.S. PATENT DOCUMENTS

| | | | |
|---|---|---|---|
| 5,365,875 A | 11/1994 | Asai et al. ................... 117/7 |
| 5,496,768 A | 3/1996 | Kudo ........................ 437/174 |
| 5,498,904 A | 3/1996 | Harata et al. | |
| 5,616,506 A | 4/1997 | Takemura ................... 438/150 |
| 5,712,191 A | * 1/1998 | Nakajima et al. | |
| 5,824,574 A | * 10/1998 | Yamazaki | |
| 5,858,822 A | * 1/1999 | Yamazaki et al. | |
| 6,057,183 A | 5/2000 | Koyama et al. ............ 438/166 |
| 6,096,581 A | 8/2000 | Zhang et al. ................ 438/149 |

FOREIGN PATENT DOCUMENTS

| | | | |
|---|---|---|---|
| EP | 0631325 A2 | 12/1994 | ......... H01L/29/784 |
| EP | 0655774 A2 | 5/1995 | .......... H01L/21/20 |
| JP | 408008179 | * 1/1996 | |
| JP | 09027453 | 1/1997 | .......... H01L/21/20 |
| JP | 09260681 | 10/1997 | ......... H01L/29/786 |

OTHER PUBLICATIONS

JP8–8179–A, Machine–Assisted Translation (MAT).*

Nishimura, et al., "Metal–Oxide–Semiconductor Field–Effect Transistors and a Ring Oscillator Fabricated in Laser–Recrystallized Polycrystalline Silicon Islands," Appl. Phys. Lett. 42(1), Jan. 1, 1983, pp. 102–104.

* cited by examiner

Primary Examiner—Long Pham
Assistant Examiner—Scott A Brairton
(74) Attorney, Agent, or Firm—Hogan & Hartson, L.L.P.

(57) ABSTRACT

A line beam is irradiated such that edge lines of the beam extend in a direction at an angle of 45° with respect to the vertical direction or the horizontal direction. As a result, a laser defective crystallization region R' where the grain size has not become sufficiently large due to unevenness in intensity of the line beam passes at 45° across the carrier path connecting source and drain regions S and D to each other. The defective crystallization region R' thus does not completely divide between the contact region CT, i.e., the carrier path between the source and drain regions. Therefore, a carrier path CP can be securely maintained without passing through the defective crystallization region R', so that the ON-current is prevented from being reduced. Deterioration or unevenness in transistor characteristics caused by unevenness in intensity of laser irradiation can thus be prevented.

21 Claims, 9 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, particularly a liquid crystal display (LCD), and especially, to a driver circuit including type LCD in which a thin film transistor (TFT) is formed in a display section and a peripheral section of a panel.

2. Description of the Related Art

In recent years, because advantage of the small size and thickness and low power consumption, an LCD (liquid crystal display) has been put into practice in the field of OA and AV devices. In particular, an active matrix type provided with a TFT, as a switching element for controlling timings for rewriting image data on pixels, realizes motion animation display with a large screen and high resolution, and is therefore used in displays of various television systems, personal computers, and the like.

A TFT is a field effect transistor obtained by forming a semiconductor layer together with a metal layer in a predetermined form, on an insulating substrate. In an active matrix type LCD, a pair of opposing substrates are arranged so as to sandwich liquid crystal therebetween, and one electrode of each of a plurality of capacitors for driving liquid crystal formed between the pair of substrates is connected with a corresponding TFT.

An LCD using polycrystal silicon (p-Si) as a semiconductor layer of TFTs in place of amorphous silicon (a-Si), which had frequently been adopted has been developed, and annealing using a laser beam for growth of grains has been put to use. In general, p-Si has a higher mobility than a-Si so that TFTs can be down-sized and a high aperture ratio and high resolution can be realized. In addition, since it is possible to adopt a gate self-aligning structure by means of using p-Si, fine TFT element is achieved and the parasitic capacitance can be reduced so that higher speed TFTs can be achieved. Consequently, an electrically complementary connection structure, e.g., a CMOS (Complementary Metal Oxide Semiconductor) can be constructed using an n-ch TFT and a p-ch TFT so that a high-speed drive circuit can be formed by adopting p-Si TFT. Since a driver circuit section can therefore be formed to be integral with a display area on the same substrate, the manufacturing costs can be reduced and the LCD module realizes a small size.

As a method of forming a p-Si film on an insulating substrate, there are a recrystallization method by annealing a-Si formed under a low temperature or a solid phase growth method under a high temperature. In any case, the process must be carried out under a high temperature of 900° C. or more. Therefore, it is not possible to use a low price glass substrate in view of heat resistance, but a quartz glass substrate of a high price is required, resulting in a high manufacturing cost. In contrast, developments have been made to a method which allows use of a low price glass substrate as an insulating substrate by performing silicon polycrystallization processing at a relatively low temperature of 600° C. or less, with use of laser annealing. This kind of method in which the processing temperature is thus 600° C. or less throughout all the steps of manufacturing TFTs is called a low-temperature process, and is necessary for mass-production of LCDs at low costs.

FIG. 1 is a plan view showing a relationship between a substrate 1 to be processed and directions of excimer laser irradiation and scanning, in excimer laser annealing (ELA). The substrate 1 to be processed is a popular non-alkaline glass substrate, and a-Si layer is formed on the surface of the substrate. An active matrix substrate 5 include a part of an LCD which includes display area 2 having a parality of pixels arranged in a matrix and gate drivers area 3 and drain drivers area 4 formed in peripheral portions of the display area 2. The substrate 1 is a mother glass substrate including a plurality of the active matrix substrates 5. At each of the display area 2, a pixel electrode as one of the electrodes of a pixel capacitor for driving liquid crystal will be formed such that the electrodes will be formed and arranged in a matrix, and TFTs will be formed so as to be respectively connected with the electrodes. The gate driver 3 will be mainly constructed of a shift register, and the drain driver 4 will be mainly constructed of a shift register and a sample-and-hold circuit. These drivers 3 and 4 will be formed by a TFT array such as CMOS or the like.

The substrate 1 is subjected to ELA to polycrystallize a-Si to form p-Si. The ELA is carried out by irradiating a line beam obtained from a predetermined optical system and by providing the line beam to scanning. Scanning is performed by shifting every laser pulse by a predetermined pitch such that the laser beams runs and draws edge lines as indicated by broken lines C in FIG. 4. However, a p-Si film formed thus by ELA has a problem that a linear region attaining only a low crystallinity where the grain size has not become sufficiently large is formed along a beam line direction. Here, each of TFTs formed on the substrate 1 has a channel length direction and a channel width direction which correspond to either the vertical direction V or the horizontal direction H with respect to the substrate 1.

As shown in FIG. 2, the TFT formed on the substrate 1 is constituted such that a gate electrode 13 is provided on an island-like channel region CH of a p-Si film with a gate insulating film inserted therebetween. Regions LD where impurities are doped at high and low densities in P-Si are provided respectively on both sides of the channel region CH. Further, source and drain regions S and D are respectively formed outside the LD regions. A defective crystallization region linearly extending along the longitudinal direction of the line beam as described above will be positioned in the channel length direction L or the channel width direction W where an island-like TFT is formed. In particular, when such a defective crystallization region extends in the channel width direction W, the defective crystallization region remains in the direction, as indicated by reference R in FIG. 2, perfectly crossing a carrier path connecting the source and drain regions S and D with each other. Since the defective crystallization region R has a high resistance, the ON current is lowered if it exists between the source and drain regions S and D. As a result, problems appear in that the contrast ratio is lowered at the display areas and erroneous operations are caused at the drive circuit sections.

FIG. 3 shows an irradiation light intensity distribution with respect to positions in the line beam as described above. An optical system for generating a line beam is provided with a slit for adjusting the line width and a slit for adjusting the line length, to form a band-like line beam. Thus, since the line width [a] of the line beam is defined by the slits for adjusting the line width, the irradiation light intensity distribution of the line beam has substantially sharp edges and a flat intensity peak portion, as shown in FIG. 3. However, at regions A and B in FIG. 3, the intensity is very high or low and is thus quite different from the intensity at the flat portion.

Regions B where the intensity distribution has a positive or negative inclination other than right angles are considered to have been caused since short wavelength components of laser light are diffracted at the edge portions of the slit for adjusting the line width. In addition, the region A where the intensity shows a sharp peak is considered to have occurred since laser light is shielded, diffracted, or interfered with due to foreign material or the like sticking to lenses forming part of the optical system, so that unevenness in light intensity is caused and the uneven light is converged in the line width [a] direction and expanded in the line length direction. Even a slight amount of foreign material which may thus cause unevenness in light intensity, if it exists in a clean room, will be a factor which influences optical characteristics and damages the flat characteristic of the intensity distribution.

FIG. 4 shows a relationship between the laser energy and the grain size where a-Si is crystallized to form p-Si by ELA. It is apparent from this figure that the grain size is smaller if the energy is smaller or greater than an optimal energy Eo as a peak. Where the grain size of at least r or more is desired, the energy must be within the range of Ed to Eu. In FIG. 3, the light intensity is Io When the energy is Eu, and the light intensities are Id and Iu when the energy is Ed and Eu, respectively. Therefore, in the region denoted at A where the light intensity is higher than the light intensity Iu or in the region denoted by B where the intensity is lower than Id, the grain size attained is not sufficiently large and it is thus impossible to obtain a desired value r.

For example, in the example of FIG. 1, a line beam irradiated has a line width of 0.5 to 1.0 mm and a line length of 80 to 150 mm. Hence, laser light can be irradiated over the entire area by scanning the substrate 5 to be processed with this line beam a so that a large area can be processed. At the same time, however, a defective crystallization region is linearly formed along the line length direction of the beam at such a portion of the semiconductor film of the substrate which corresponds to the region A or B shown in FIG. 3. As a result, a plurality of defective crystallization regions appear like stripes on the entire substrate 1.

BRIEF SUMMARY OF THE INVENTION

The present invention has been made to solve the problems as described above and is constructed so as to provide a method for manufacturing a semiconductor device comprising a plurality of transistors each including: a polycrystal semiconductor film patterned like an island and obtained by polycrystallizing an amorphous semiconductor film formed on a substrate, by irradiating a laser beam onto the amorphous semiconductor film; an insulating film formed on a channel region of the polycrystallized semiconductor film; a gate electrode formed corresponding to the channel region with the insulating film therebetween; a source region and a drain region formed in the polycryatallized semiconductor film, such that the channel region is formed between the source and drain regions; a source electrode connected to the source region; and a drain electrode connected to the drain region, wherein the laser beam is irradiated onto the amorphous semiconductor film such that the laser beam has edge line directions on an irradiated region on the amorphous semiconductor film, which are not perpendicular to a channel length direction and a channel width direction of the channel region.

In this structure, even if a linear region not sufficiently crystallized appears in the semiconductor film due to unevenness in intensity of the irradiated laser beam, such a defectively crystallized region does not perfectly cross carrier paths in a channel of a TFT, and it is therefore possible to prevent the ON-current of the TFT from being decreased due to formation of a high-resistance region in the channel section of the TFT.

In addition, according to the present invention, the laser beam is a line beam obtained by shaping laser light emitted from a laser oscillation source, into a belt-like line, by means of a predetermined optical system consisting of a combination of a plurality of lenses.

In this structure, a linear defective crystallization region formed at a portion within a line beam where the intensity distribution of the line beam is not formed crossing the channel region. Therefore, a high-resistance region does not exist in the carrier path of the TFT, and the ON-current of the semiconductor element is prevented from being decreased.

Consequently, it is possible to prevent problems such as lowered contrast at the display area of an LCD, operation errors in the peripheral circuit section, and the like.

The line beam has a line length direction extending at an angle of 45° to at least one of the channel length direction and the channel width direction of the channel region.

Hence, a linear defective crystallization region generated due to unevenness in intensity of the line beam is always positioned at an angle of 45° to the carrier path so that the defective crystallization region does not cross the polycrystal semiconductor layer. The carrier path is therefore prevented from being completely divided to increase resistance using the defective crystallization region.

DETAILED DESCRIPTION OF THE PREFERRED EMBODIMENTS

Figure 5:
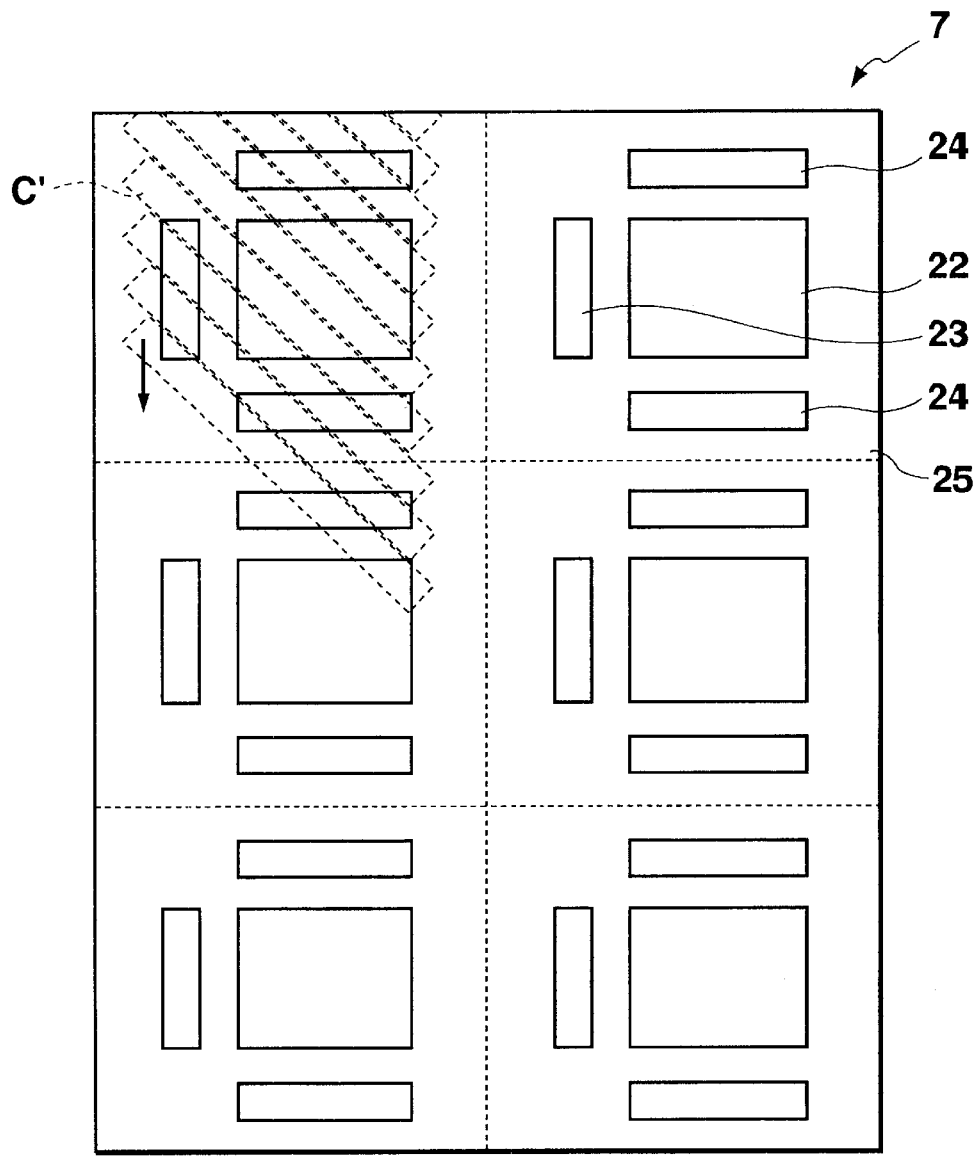
FIG. 5 is a view showing a positional relationship between a substrate to be processed and a region to be irradiated with a line beam, according to an embodiment of the present invention.
Figure 5:
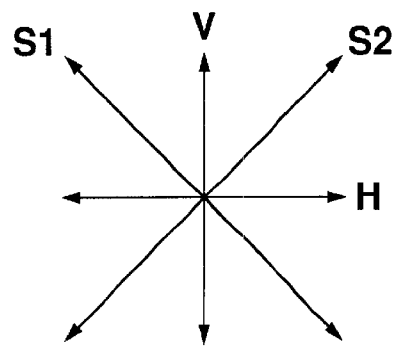

FIG. 5 shows a positional relationship between a substrate 7 to be processed and irradiating and scanning directions of a line beam. The substrate 7 to be processed is a popular non-alkaline glass substrate, and an a-Si film is formed on the surface of the glass substrate. An active matrix substrate 25 is a substrate forming one substrate of an LCD, and includes a display area 22 where a plurality of display pixels are arranged in a matrix, and gate and drain drivers area 23 and 24 each provided in around the display area 22. The substrate 7 is a mother glass substrate comprising six active matrix substrates 25 as described above. In the display area 22, pixel electrodes, each being an electrode of a pixel capacitor for driving liquid crystal, will be arranged in a matrix, and TFTs will be formed so as to be connected with the pixel electrodes. The gate driver 23 will be mainly constructed of a shift register, and the drain driver 24 will be mainly constructed of a shift register and a sample-and-hold circuit. These drivers will be constituted by a TFT array such as CMOS or the like.

Figure 6:
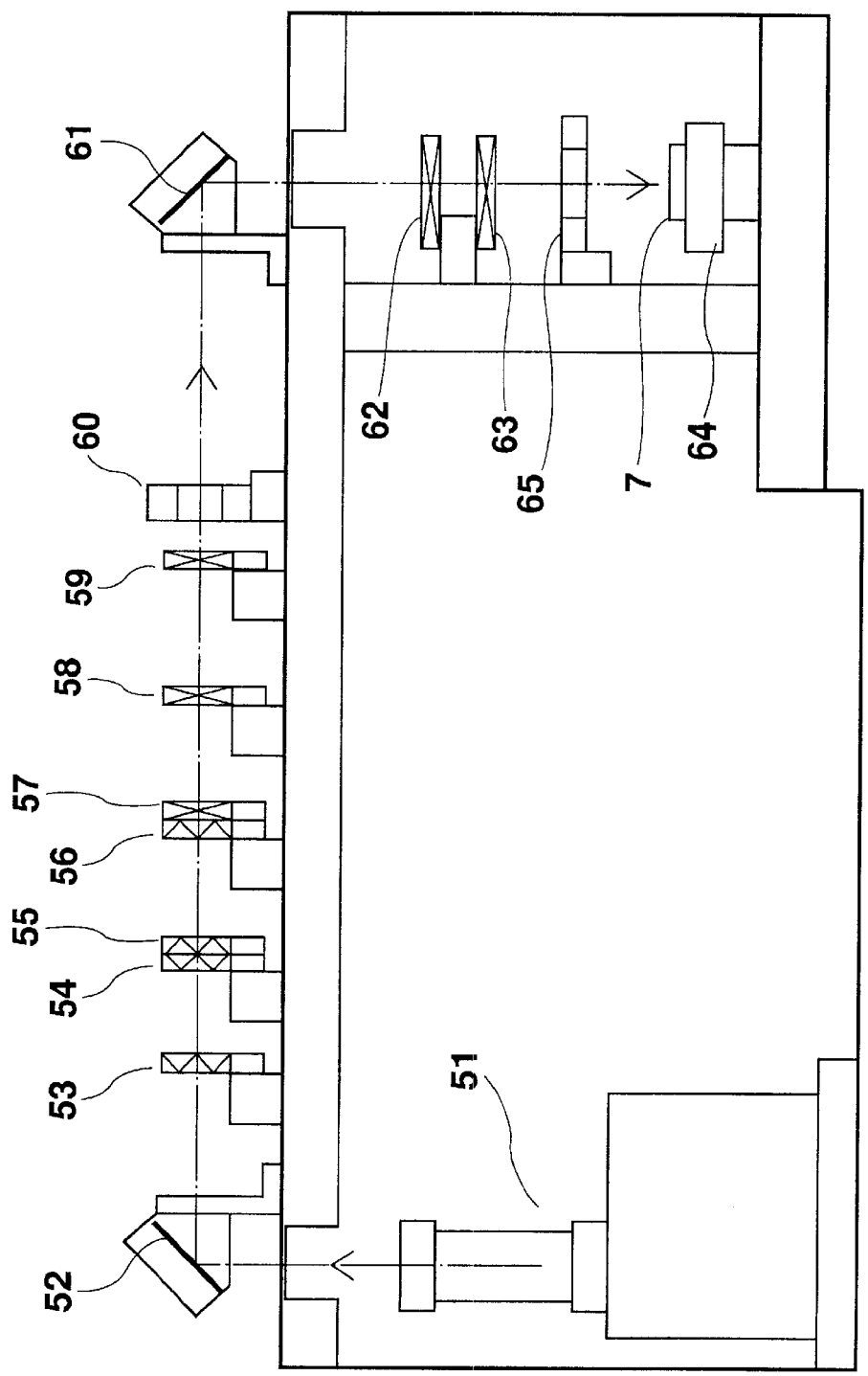
FIG. 6 is a view schematically showing the structure of a laser irradiation apparatus.
Figure 7:
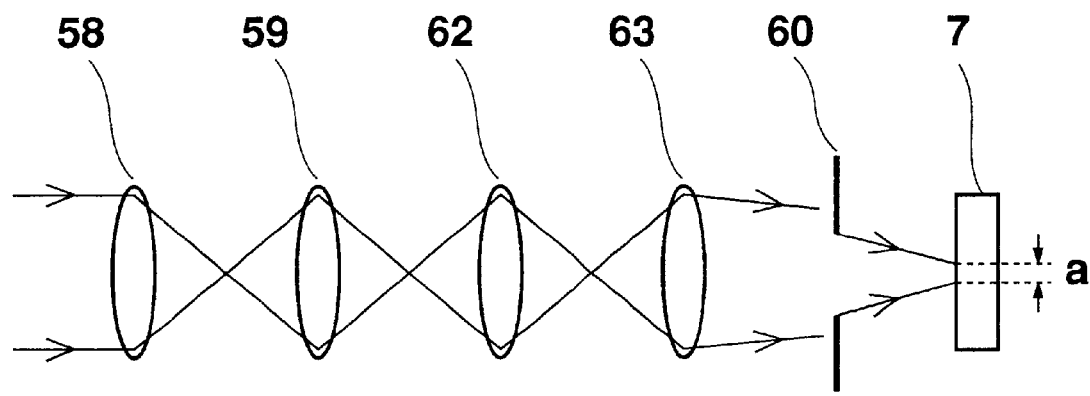
FIGS. 7 and 8 are views showing the structure of an optical system of the laser irradiation apparatus shown in FIG. 6.
Figure 8:
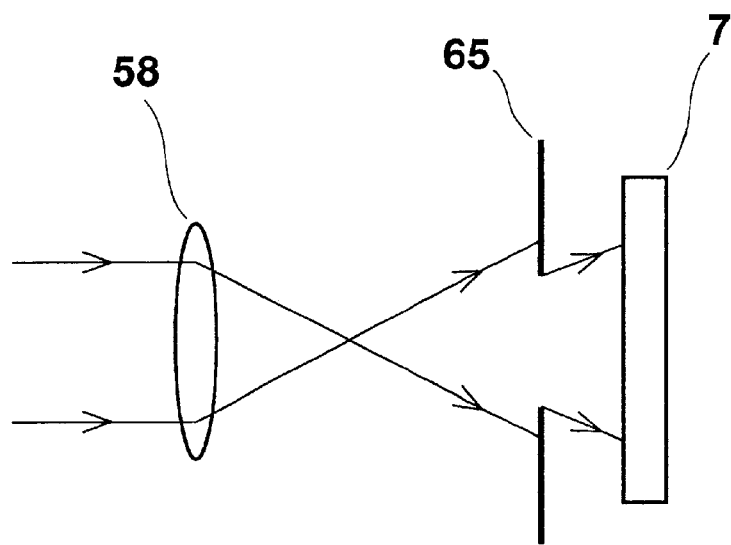

The substrate 7 is subjected to ELA to polycrystallize a-Si on the substrate to form p-Si. ELA is carried out by irradiating a line beam obtained from an optical system shown in FIG. 6 and by scanning the substrate with the line beam. The region to be irradiated has a belt-like linear shape whose edge lines extending in a direction S1 or a direction S2 perpendicular to the direction S1, as indicated by broken lines C', and the direction S1 extend at an angle of 45° with respect to each of the vertical direction V and the horizontal direction H on the substrate plane. An excimer laser is a pulse laser. A line beam of this excimer laser is intermittently irradiated on the substrate 7 to be processed and scanning is performed in a direction indicated by an arrow in FIG. 5 (which corresponds to the direction V in the figure). As shown in FIG. 5, the line beams are controlled such that irradiation regions of any two successive pulse beams are overlapped on each other by a predetermined amount.

In the following, a structure of a laser beam irradiation apparatus used for laser annealing as described above will be explained with reference to FIG. 6. In this figure, a reference 51 denotes a laser oscillation source. References 52 and 61 denote mirrors. References 53, 54, 55 and 56 denote cylindrical lenses. References 57, 58, 59, 62, and 63 denote convergence lenses. A reference 60 denotes a slit for defining the beam width, and a reference 64 denotes a stage for supporting a substrate 7 to be processed which has a surface where a-Si is formed. A reference 65 denotes a slit for defining the line length of the beam and the slit 65 extends in the line length and is provided close to the stage 64.

Laser light is an excimer laser and the laser light irradiated from the laser oscillation source 51 is shaped by two pairs of condenser lenses consisting of a pair of cylindrical lenses 53 and 55 and a pair of cylindrical lenses 54 and 56, into parallel light whose intensity has a flat output distribution in the longitudinal and lateral directions. This parallel light is converged in one direction by lenses 58, 59, 62 and 63 and is expanded in another direction by a lens 57, to be a strip-like line and irradiated on the substrate 7 to be processed. The slit 60 for defining the line width and the slit 65 for defining the line length respectively define edge portions extending in the line width and line length directions, so that the region to be irradiated has a definite shape and the intensity on the effective irradiation region is maintained constant.

The stage 64 mounting a substrate 7 to be processed is movable in X- and Y-directions and is rotation in the horizontal plane.

In this embodiment, a line beam is irradiated onto the substrate 7 to be processed in a direction inclined at an angle of 45° to the vertical direction V or horizontal direction H.

Figure 3:
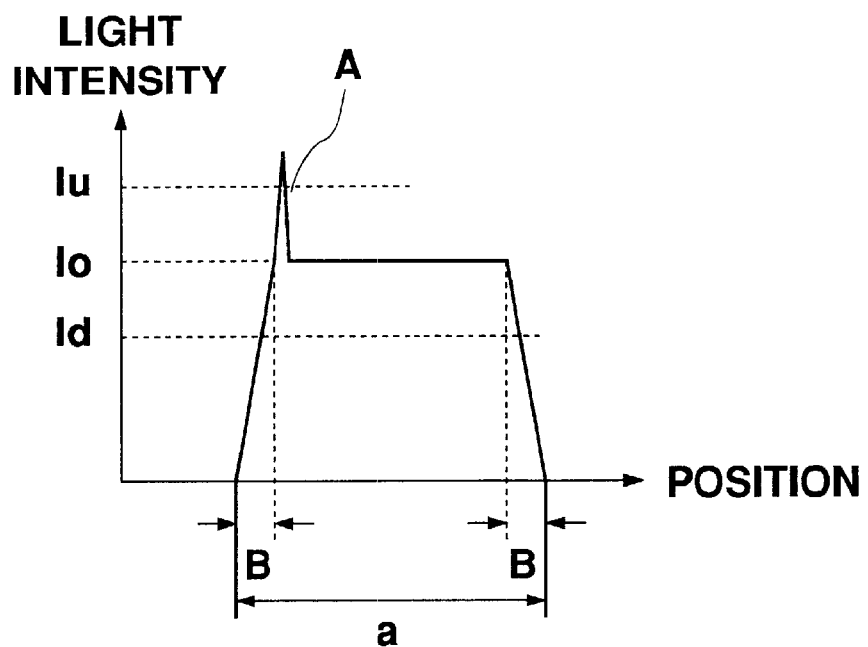
FIG. 3 is a graph showing an intensity distribution of irradiated laser.
Figure 4:
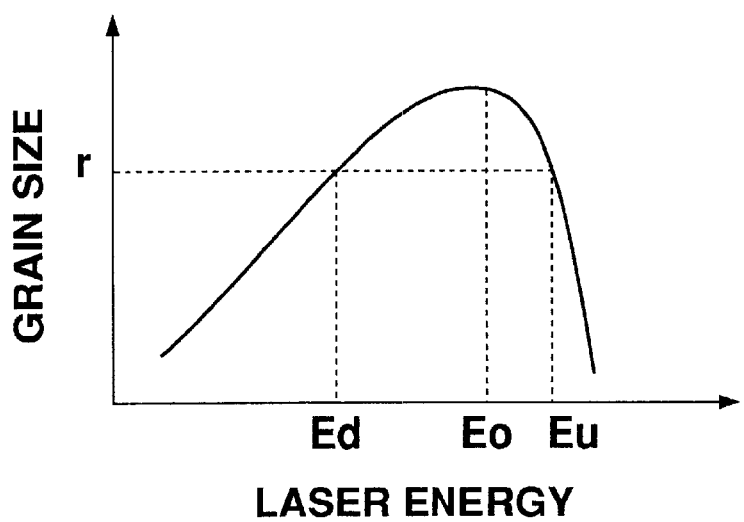
FIG. 4 is a graph showing a relationship between laser energy and grain size.

The line beam thus generated has an irradiation light intensity distribution along the direction of the line width [a] as shown in FIG. 3. Therefore, a defective crystallization region R' is formed along the line length direction (or the line longitudinal direction) of the line beam if the line beam is irradiated onto the substrate 7 by setting the line length direction of the line beam at an angle of 45° with respect to the vertical direction V or horizontal direction H of the substrate, with use of the optical apparatus shown in FIG. 6. Thus, a defective crystallization region R' occurs in the direction oblique to aside of the substrate 7 at 45° in the semiconductor film of the substrate 7.

Meanwhile, in each TFT formed on the substrate 7, a non-doped channel region CH, lightly-doped regions LD, and heavily-doped source and drain regions S and D are formed in an island-like p-Si film 11. On the channel region CH, a gate electrode 13 is formed with a gate insulating film inserted therebetween.

Figure 10:
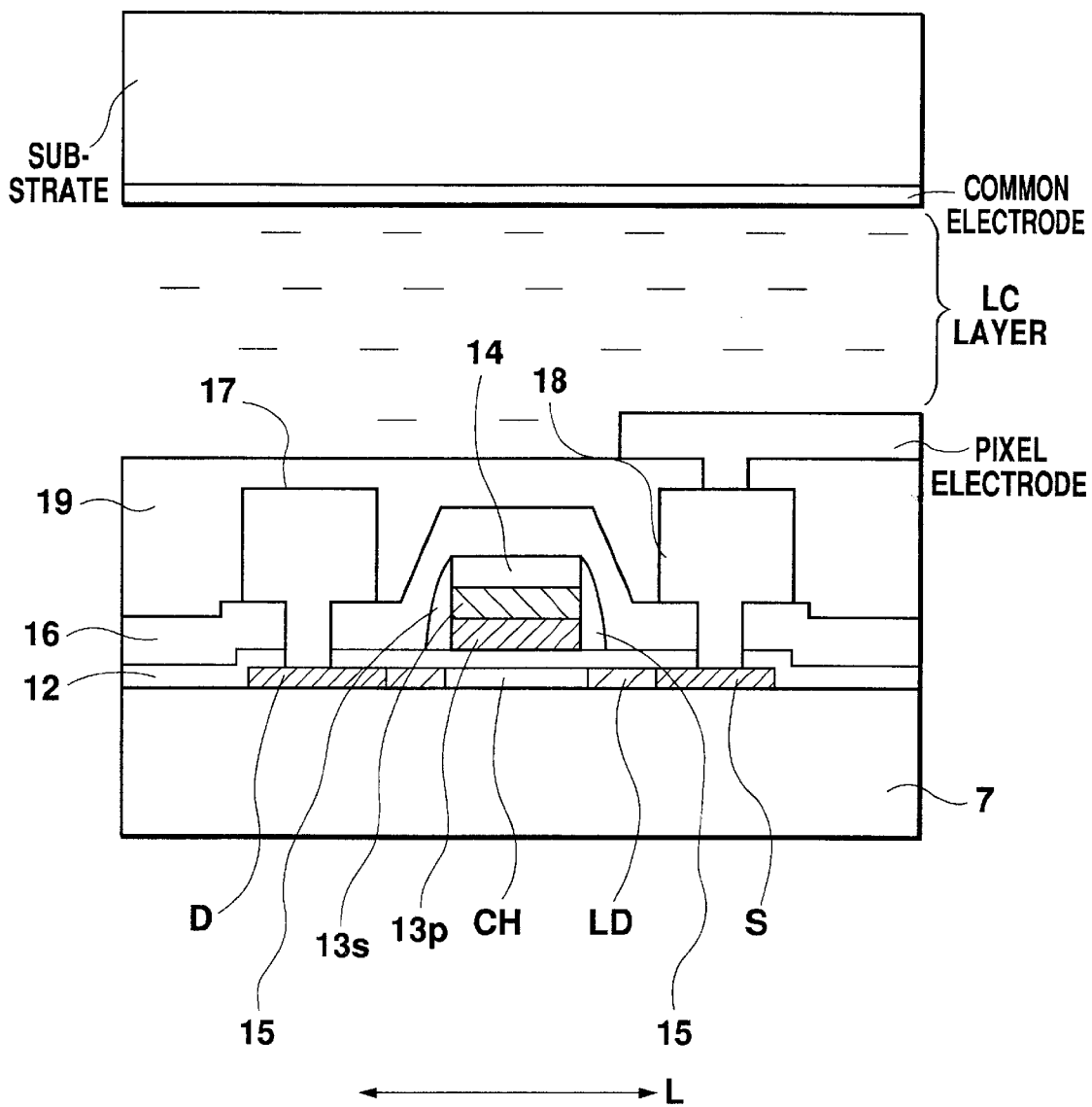
FIG. 10 is a view showing a cross-section of a TFT according to an embodiment of the present invention.

FIG. 10 is a cross-sectional view where a LCD is completed. An island-like p-Si film 11, a non-doped channel region CH, regions LD respectively positioned on both sides of the channel region CH, and source and drain regions S and D positioned outside the regions LD are formed on a non-alkaline glass substrate 10 as a substrate to be processed. A gate insulating film 12 is formed on the p-Si film 11, and a gate electrode 13 formed by a doped p-Si film 13p, tungsten silicide 13s, and the like is formed at a region corresponding to the channel region. An implantation stopper 14 for preventing counter-doping when implanting ions of a different conductive type in the CMOS structure is formed on the gate electrode. Previously prepared margins are formed corresponding to the side walls 15 so that the regions LD do not extend from the under region of the gate electrode 13 when impurities implanted into the p-Si film 11 are diffused in the lateral direction by annealing. A first inter-layer insulating film 16 is formed on the entire surface so as to cover the above components. Drain and source electrodes 17 and 18 made of low-resistance metal are formed on the first inter-layer insulating film 16 and are respectively connected with drain and source regions D and S through contact holes formed in the gate insulating film 12 and inter-layer insulating film 16. Further, a second inter-layer insulating film 19 with planarization effect is formed on the entire surface so as to cover the above components. In the display area, a pixel electrode for driving liquid crystal is formed on the second inter-layer insulating film 19 and is connected with a source electrode 18 through a contact hole formed above the source electrode 18. The drain and source regions S and D are brought into contact with the drain and source electrodes 17 and 18, by contact holes CT indicated and surrounded by broken lines in FIG. 2. In the display area, a substrate is disposed so as to oppose the substrate 7 as shown in FIG. 10, and a liquid crystal (LC) layer is provided between the substrate. A common electrode is formed on the opposing substrate, and a plurality of pixel capacitors for driving the liquid crystal are constructed between above the common electrode and a plurality of pixel electrodes. However, the pixel electrode and LC layer are not disposed in the driver circuit section arranged in the peripheral of the display area on the substrate 7.

Figure 1:
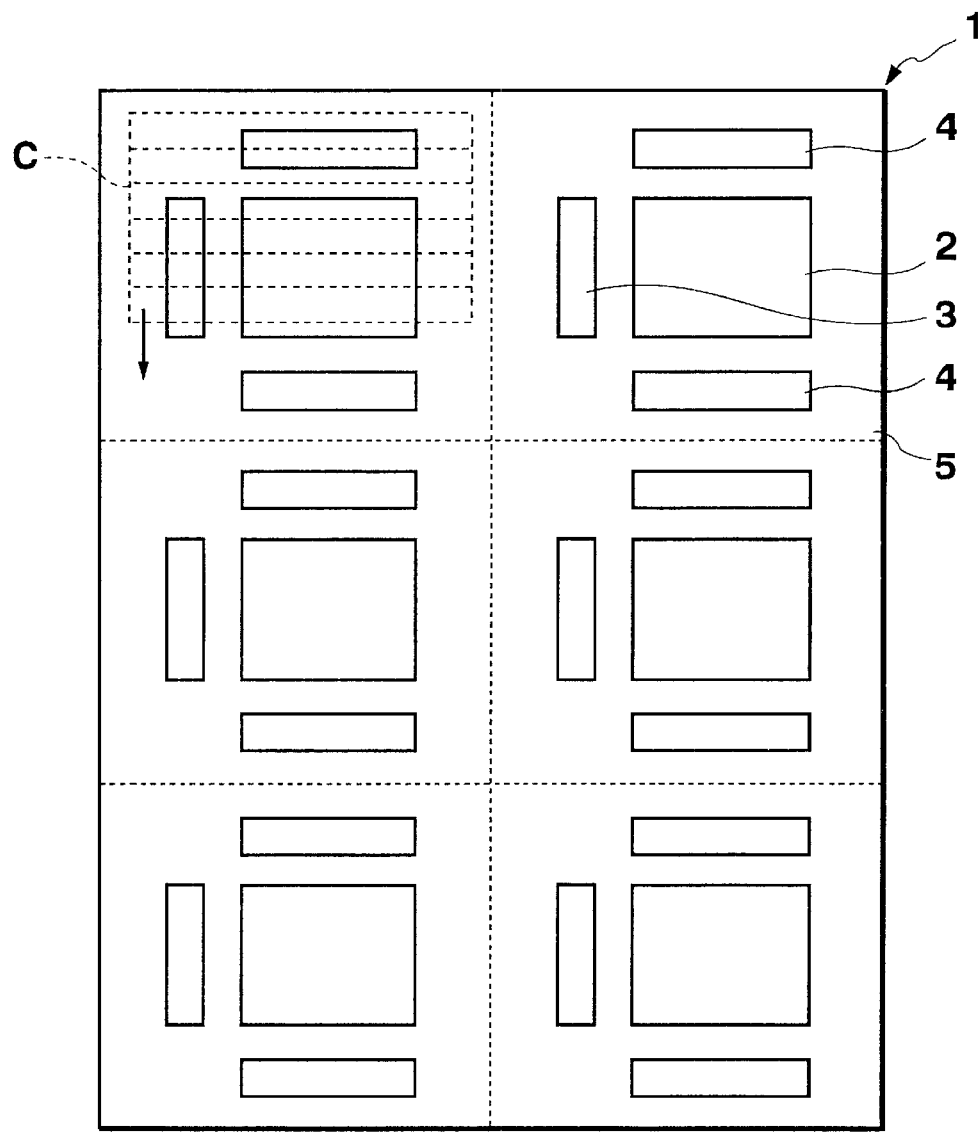
FIG. 1 is a view explaining a conventional positional relationship between a substrate to be processed and a line beam.
Figure 1:
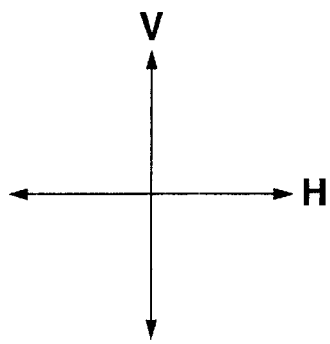
Figure 2:
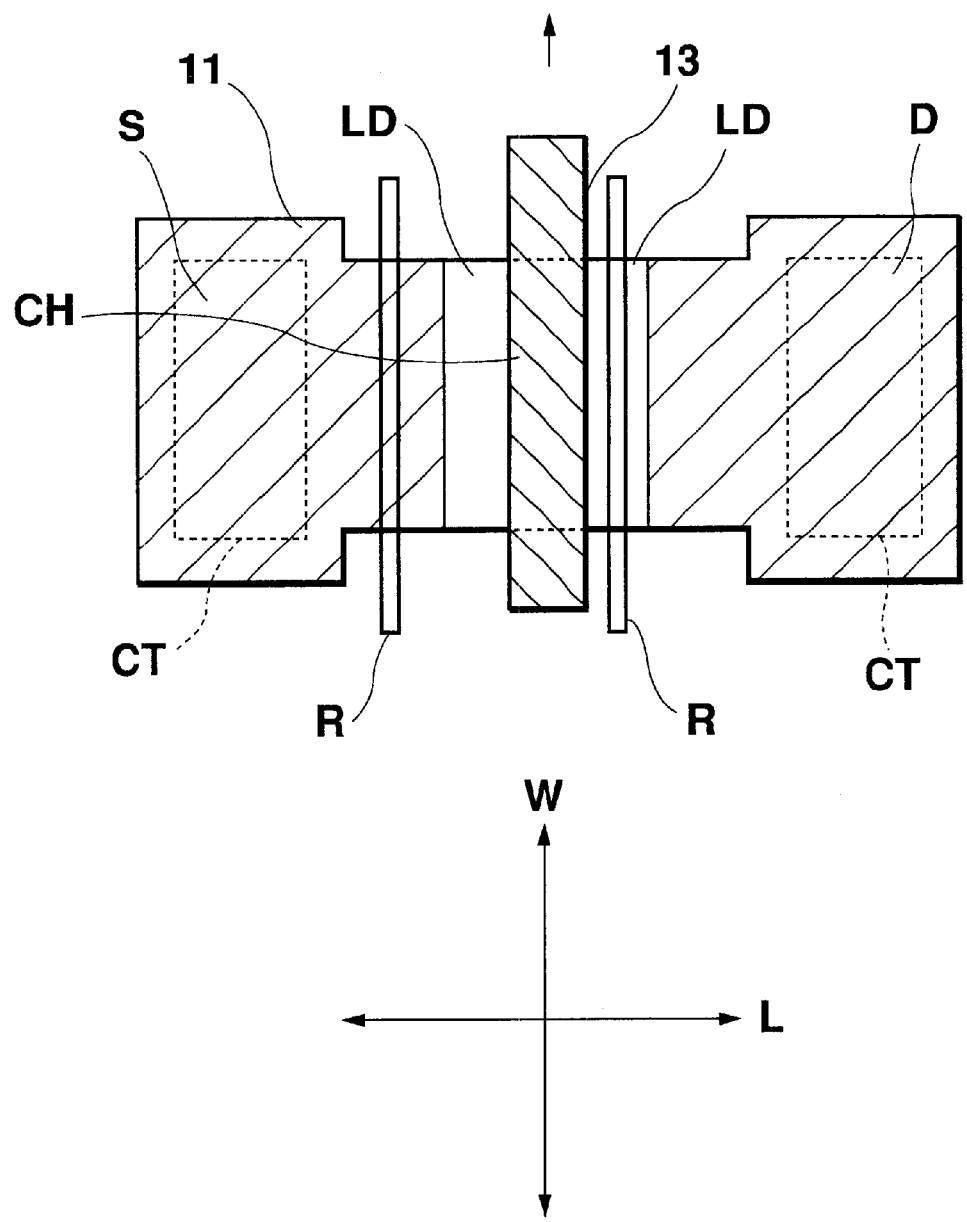
FIG. 2 is a plan view explaining a defective crystallization region of a TFT subjected to annealing by ELA as shown in FIG. 1.
Figure 9:
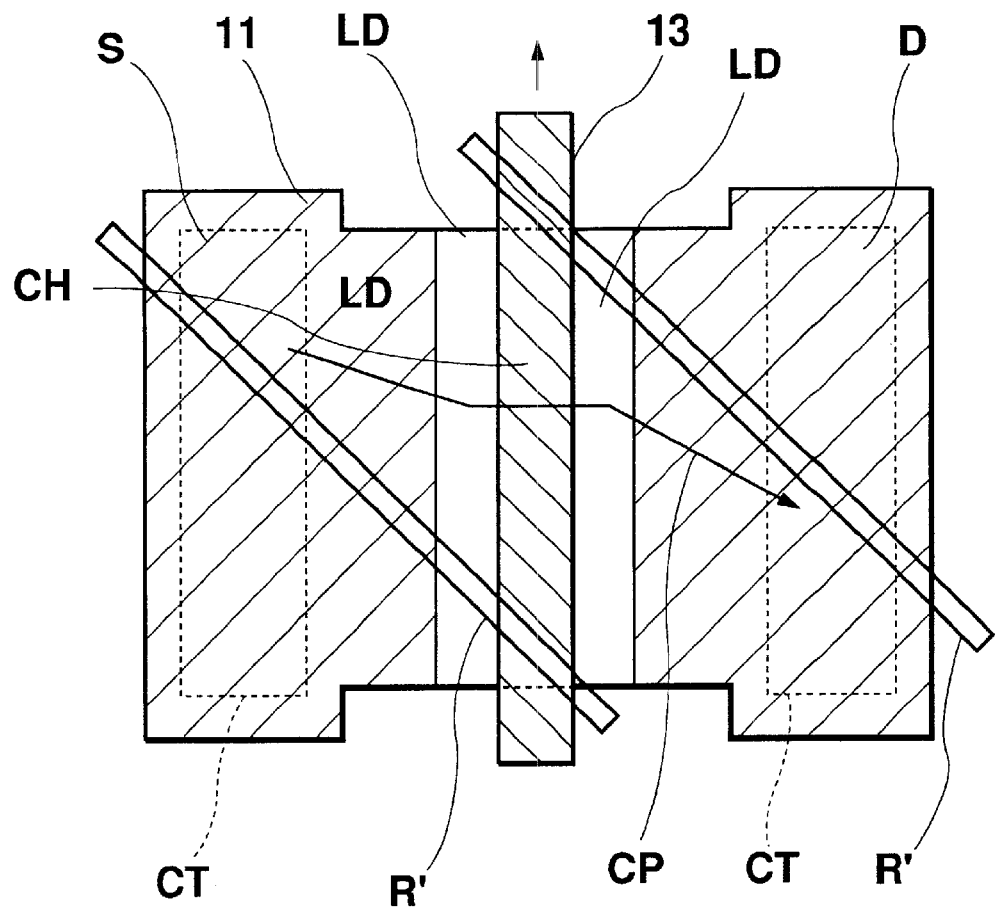
FIG. 9 is a view showing a positional relationship between a TFT channel region and a defective crystallization region, according to an embodiment of the present invention.
Figure 9:
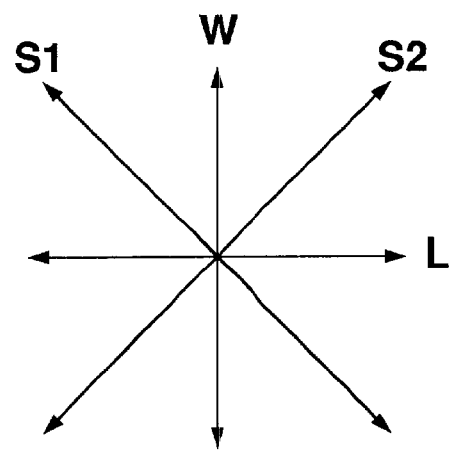

The TFT as described above is formed such that the channel length direction L or the channel width direction W complies with the vertical direction V or the horizontal direction H in the substrates 1 and 5. Therefore, a defective crystallization region R' extending along the edge lines of the irradiated region or in the longitudinal direction of the line beam is positioned at an angle of 45° with respect to the channel length direction L or the channel width direction W of the TFT as shown in FIG. 9, by setting the directions S1 and S2 of edge lines C' of an irradiated region with a line beam, as shown in FIG. 5. Accordingly, the defective crystallization region R' obliquely crosses, at 45°, a carrier path connecting the source and drain regions S and D to each other, with the channel region CH and regions LD formed therebetween. Consequently, a defective crystallization region R formed as shown in FIG. 2 does not perfectly separate the carrier path, so that the defective crystallization region R' is positioned to be oblique at 45° to the channel length direction L or channel width direction W of the TFT, as shown in FIG. 9. In this embodiment, thus, there is no defective crystallization region R' perfectly separating the carrier path connecting the source and drain regions S and D sandwiching the channel region CH and the regions LD.

For example, in a conventional case as shown in FIG. 2, a defective crystallization region R generated at a source region S, a drain region D or channel region in a semiconductor film perfectly separates a contact portion CT of the source region and a contact portion CT of the drain region from each other. However, in the present embodiment, a defective crystallization region R is inclined with respect to the channel length direction L and channel width direction W of the TFT. Taken into consideration a defective crystallization region R, as shown in FIG. 9, an end of this region reaches the a contact portion CT of a source or drain region, while another end of this region reaches a channel region. However, in this case, a carrier path CP is securely maintained between the source and drain regions without being separated by a defective crystallization region R' having a high resistance, as indicated by an arrow in the figure. Since a carrier path is thus maintained, reductions in the ON-current of the TFT are restricted.

Particularly, in the case of TFTs in a peripheral drive circuit, the channel width is 100 to 500 μm which is much larger than the channel length which is 5 to 10μm. Therefore, if the direction of the edge lines is set to an angle of 45° with respect to the channel length L (or the channel width W), one defective crystallization region R' reaches either one of the contact portions CT of the drain and source regions and does not perfectly separate the carrier path. Accordingly, a carrier path CP connecting contact portions CT of source and drain regions to each other can be securely maintained without passing through a defective crystallization region having a high resistance, so that reductions in ON-current are prevented in a peripheral drive circuit for which an operation speed is significant.

In the above description, the longitudinal direction of edge lines C is set to an angle of 45° with respect to any edge of the substrate 7. This is particularly because TFTs in which the direction of the channel length L or the direction of the channel width W is oriented in the horizontal direction H of the substrate 7 and TFTs in which the direction of the channel length L or the direction of the channel width W is oriented in the vertical direction V exist at substantially equal ratios of number, in the driver sections 3 and 4 whose operations are greatly influenced by an increase in ON-resistance. Therefore, according to the setting as adopted in the present embodiment, any of the TFTs can achieve the same results as in the case of FIG. 9.

Figure 11:
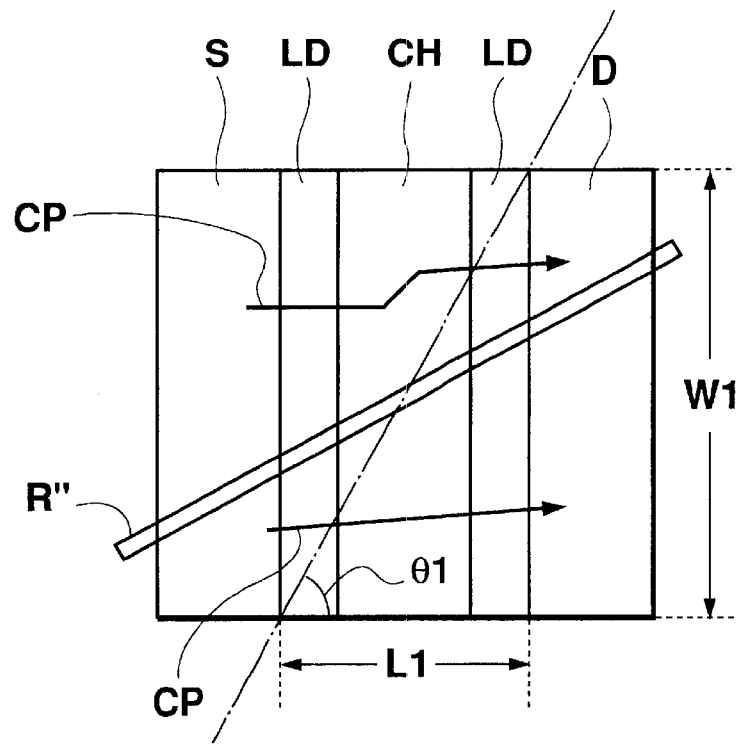
FIGS. 11 and 12 are views each showing a relationship between a direction in which a channel of a TFT formed on a substrate extends and a direction in which a defective crystallization region extends.
Figure 12:
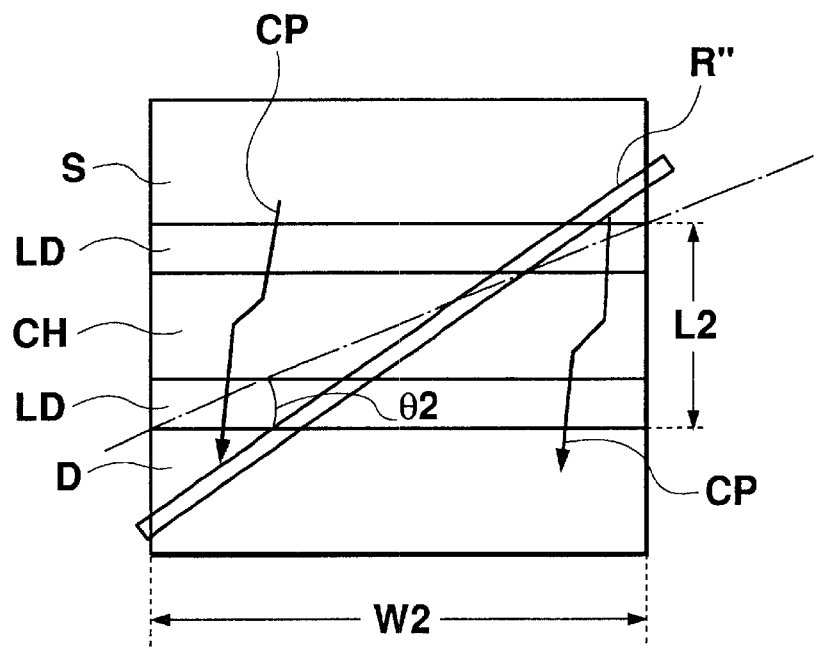

Another embodiment of the present invention is not limited to the above-description. As shown in FIGS. 11 and 12, the longitudinal direction of edge lines C is set to a direction ranging between a direction defined by a value θ1 of $\tan^{-1}(W1/L1)$ obtained by the channel length L1 and channel width W1 of TFTs in which the channel is oriented in a certain direction, and a direction defined by a value θ2 of $\tan^{-1}(L2/W2)$ obtained by the channel length L2 and channel width W2 of TFTs in which the channel is oriented in a direction perpendicular to the certain direction. As a result of this, in any of the TFTS, the defective crystallization region R" does not separate the carrier path CP in the channel regions. Here, since the source and drain regions S and D are doped with impurities at a high density, a high mobility is obtained regardless of the crystallization condition of the p-Si film 11. Therefore, according to the setting as described above, a carrier path extending from the source region S to the drain region D is always securely maintained, so that ON-currents are prevented from being lowered.

In particular, as shown in FIG. 11, much greater effects than obtained in the above case can be attained if setting of the channel lengths L1 and L2 is carried out not only for a non-doped channel region CH but also for a light-doped region LD. Specifically, the impurity density of the source region S is different by two orders of magnitude from that of the LD region, and therefore, the effect of preventing an ON-current from being lowered sufficiently is obtained by securely maintaining a carrier path connecting the source and drain regions S and D.

In a case where the ratio in number of the group of TFTs shown in FIG. 11 to another group of TFTS shown in FIG. 12 is extremely large, the effect can be improved much more by setting the direction of edge lines C at an angle which is advantageous for only one group of TFTs. Specifically, as for the defective crystallization region R" crossing the channel region CH (and the region LD), the greater the angle of the region R" to the channel length direction is, the higher the probability at which carriers moving between the source and drain regions S and D pass through the defective crystallization region R" is, resulting in an increase in ON-resistance. Therefore, the characteristics of TFTs can be improved and the performance of the entire drivers 5 and 6 can accordingly be improved, by setting the angle of the defective crystallization region R" to a small angle with respect to the channel length direction, for the group of TFTs existing at a higher ratio.

What is claimed is:

1. A method for manufacturing a semiconductor device comprising a plurality of transistors each including:

a polycrystal semiconductor film patterned and obtained by polycrystallizing an amorphous semiconductor film formed on a substrate, by irradiating a laser beam onto the amorphous semiconductor film;

an insulating film formed on a channel region of the polycrystallized semiconductor film, a gate electrode formed corresponding to the channel region with the insulating film therebetween;

a source region and a drain region formed in the polycrystallized semiconductor film, such that the channel region is formed between the source and drain regions;

a source electrode connected to the source region; and a drain electrode connected to the drain region, wherein the laser beam is irradiated onto the amorphous semiconductor film such that the laser beam has edge line directions on an irradiated region on the amorphous semiconductor film which are not perpendicular to a channel length direction and a channel width direction of the channel region, and wherein the edge line directions are determined in response to the length of channel length and width of the channel region.

2. A method according to claim 1, wherein the laser beam is a line beam obtained by shaping laser light emitted from a laser oscillation source into a belt-like line by means of an optical system consisting of a combination of a plurality of lenses.

3. A method according to claim 1, wherein the line beam has a line length direction extending at an angle of 45° to at least one of the channel length direction and the channel width direction of the channel region.

4. A method according to claim 1, wherein the laser beam is a belt-like line beam emitted from a laser irradiation apparatus for irradiating the line beam to the semiconductor film, laser irradiation apparatus comprising:
   an oscillation source for generating laser light;
   a beam width adjusting optical system for adjusting a beam width of the laser beam, comprising a plurality of lenses;
   a beam length adjusting optical system for adjusting a beam length of the laser beam, consisting of a plurality of lenses;
   a beam width defining slit for defining the beam width of the laser beam;
   a beam length defining slit for defining the beam length of the laser beam; and
   a support stage for mounting the substrate at a position to be irradiated by the line beam formed by the beam width adjusting optical system, the beam length adjusting optical system, the beam width defining slit, and the beam length slit, said support stage being movable in parallel and rotatable in a plane vertical to a direction in which the line beam runs,
   wherein a longitudinal direction of the line beam is inclined with respect to the channel width direction or the channel length direction of the transistors formed on the substrate.

5. A method for manufacturing a liquid crystal display device comprising a plurality of thin film transistors formed on a substrate, each of said thin film transistors including:
   a polycrystal semiconductor film patterned and obtained by polycrystallizing an amorphous semiconductor film formed on a substrate, by irradiating a laser beam onto the amorphous semiconductor film;
   an insulating film formed on a channel region of the polycrystallized semiconductor film;
   a gate electrode formed corresponding to the channel region with the insulting film therebetween;
   a source region and a drain region formed in the polycrystallized semiconductor film, such that the channel region is formed between the source and drain regions;
   a source electrode connected to the source region; and
   a drain electrode connected to the drain region, wherein the laser beam is irradiated onto the amorphous semiconductor film such that the laser beam has edge line directions on an irradiated region on the amorphous semiconductor film which are not perpendicular to a channel length direction and a channel width direction of the channel region, and wherein the edge line directions are dictated in response to the length of channel length and width of the channel region.

6. A method according to claim 5, wherein the thin film transistor is used as a switching element for a display section on the substrate and as a switching element for a driver circuit provided around display section.

7. A method according to claim 1, wherein the edge line direction of the laser beam is set to be oriented within a range between a direction expressed by $\tan^{-1}(W1/L1)$ and a direction expressed by $\tan^{-1}(L2/W2)$, wherein L1 and W1 are respectively a channel length and a channel width of a first transistor, which has a channel extending in a first direction, while L2 and W2 are respectively a channel length and a channel width of a second transistor, which has a channel extending in a second direction perpendicular to the first direction.

8. A method according to claim 7, wherein the source and drain regions are formed by doping impurities having one conductivity type into the polycrystallized semiconductor film,
   the channel region is formed of an intrinsic layer of the polycrystallized semiconductor film or formed by doping impurities having other conductivity type opposite to that of the source and drain regions,
   lightly doped regions doped at a small dose with impurities having a conductivity type same as that of the source and drain regions are formed between the channel region and the source and drain regions, and each of the channel lengths L1 and L2 is a length summing the channel region and the lightly doped regions.

9. A method of claim 5, wherein the edge line direction of the laser beam is set to be oriented within a range between a direction expressed by $\tan^{-1}(W1/L1)$ and a direction expressed by $\tan^{1}(L2/W2)$, wherein L1 and W1 are respectively a channel length and a channel width of a first transistor, which has a channel extending in a first direction, while L2 and W2 are respectively a channel length and a channel width of a second transistor, which has a channel extending in a second direction perpendicular to the first direction.

10. A method of claim 9, wherein the source and drain regions are formed by doping impurities having one conductivity type into the polycrystallized semiconductor film,
   the channel region is formed of an intrinsic layer of the polycrystallized semiconductor film or formed by doping impurities having other conductivity type opposite to that of the source and drain regions,
   lightly doped regions doped at a small dose with impurities having a conductivity type same as that of the source and drain region are formed between the channel region and the source and drain regions, and each of the channel lengths L1 and L2 is a length summing the channel region and the lightly doped regions.

11. A method for manufacturing a semiconductor device, comprising the steps of:
   providing a substrate;
   forming an amorphous silicon film on the substrate, the amorphous silicon film defining a channel region comprising a channel length and a channel width; and
   annealing the amorphous silicon film into a polycrystal silicon film using a laser beam having an edge line direction, wherein the edge line direction of the laser beam is neither parallel nor perpendicular to the channel length or channel width direction of the channel region formed on the amorphous silicon film and the scanning direction of the beam is determined to be along the extending direction of any one edge of the substrate.

12. A method of claim 11, further comprising the steps of:
   forming an insulating film on the channel region of the polycrystal silicon film; forming a gate electrode on the insulating film and disposed in association with the channel region;
   forming a source region and a drain region in the polycrystal silicon film so that the channel region is formed between the source and drain regions;

connecting a source electrode to the source region; and connecting a drain electrode to the drain region.

13. A method of claim 11, wherein the laser beam is a line beam obtained by shaping a laser light emitted from a laser oscillation source into a belt-like line using a plurality of lenses.

14. A method of claim 11, wherein the line beam has a line length direction extending at an angle of 45 degrees to at least one of the channel length direction and the channel width direction of the channel region.

15. A method for manufacturing a semiconductor device, comprising the steps of:

providing a substrate;

forming an amorphous silicon film on the substrate, the amorphous silicon film defining a channel region comprising a channel length and a channel width; and annealing the amorphous silicon film into a polycrytal silicon film using a laser beam having an edge line direction, wherein the edge line direction is responsive to the channel length and the channel width to substantially prevent forming of a crystal defect across a carrier moving path within the channel region;

wherein the edge line directions of the laser beam are oriented to anneal the amorphous semiconductor film at an angle between $\tan^{-1}$ (W1/L1) and $\tan^{-}$(L2/W2), wherein L1 and W1 are channel length and width, respectively, of a first transistor, which has a channel extending in a first direction, while L2 and W2 are channel length and width, respectively, of a second transistor, which has a channel extending in a second direction perpendicular to the first direction.

16. A method of claim 15, further comprising the steps of:

forming an insulating film on the channel region of the polycrystal silicon film;

forming a gate electrode on the insulating film and disposed in association with the channel region;

forming a source region and a drain region in the polycrystal silicon film so that the channel region is formed between the source and drain regions;

connecting a source electrode to the source region; and connecting a drain electrode to the drain region.

17. A method of claim 15, wherein the laser beam is a line beam obtained by shaping a laser light emitted from a laser oscillation source into a belt-like line using a plurality of lenses.

18. A method of claim 15, wherein the line beam has a line length direction extending at an angle of 45 degrees to at least one of the channel length direction and the channel width direction of the channel region.

19. A method for manufacturing a semiconductor device comprising a plurality of transistors, each including:

a polycrystal semiconductor film patterned and obtained by polycrystallizing an amorphous semiconductor film formed on a substrate, by irradiating a laser beam onto the amorphous semiconductor film;

an insulating film formed on a channel region of the polycrystallized semiconductor film;

a gate electrode formed corresponding to the channel region with the insulting film therebetween;

a source region and a drain region formed in the polycrystallized semiconductor film, such that the channel region is formed between the source and drain regions;

a source electrode connected to the source region; and a drain electrode connected to the drain region;

wherein the laser beam is irradiated onto the amorphous semiconductor film such that the laser beam has edge line directions on an irradiated region of the amorphous semiconductor film which are not perpendicular to a channel length direction and a channel width direction of the channel region, and wherein the scanning direction of the beam is determined to be along the extending direction of any one edge of the substrate.

20. A method for manufacturing a semiconductor device, comprising the steps of:

forming an amorphous silicon film on a substrate, the amorphous silicon film defining a channel region comprising a predetermined channel length and a predetermined channel width; and annealing the amorphous silicon film into a polycrystaline silicon film by irradiating the amorphous silicon film with a line laser beam, wherein the amorphous silicon film is annealed by scanning the amorphous silicon film with the line laser beam, utilizing movement of a stage carrying the substrate, an edge direction of the line laser beams is neither parallel nor perpendicular to a channel length or channel width direction of the channel formed on the amorphous silicon film, and a direction in which the beam scans the amorphous silicon film is along a direction of a vertical or a horizontal edge of the substrate.

21. The method for manufacturing a semiconductor device according to claim 20, wherein the edge direction of the line laser beam is neither parallel nor perpendicular to a direction of any vertical or horizontal edge of the substrate.

* * * * *